(12) United States Patent
Chandhok

(10) Patent No.: US 7,033,734 B2
(45) Date of Patent: Apr. 25, 2006

(54) DIPOLE ILLUMINATION

(75) Inventor: Manish Chandhok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 309 days.

(21) Appl. No.: 10/377,056

(22) Filed: Feb. 28, 2003

(65) Prior Publication Data

US 2004/0170926 A1    Sep. 2, 2004

(51) Int. Cl.
*G03B 27/54* (2006.01)
(52) U.S. Cl. ............. 430/311; 430/394; 430/396; 250/492.22; 250/492.2; 355/67
(58) Field of Classification Search ........ 430/311, 430/394, 396; 250/492.22, 492.2; 359/11
See application file for complete search history.

(56) References Cited

U.S. PATENT DOCUMENTS

| | | |
|---|---|---|
| 5,821,034 A | 10/1998 | Kim et al. |
| 6,096,458 A | 8/2000 | Hibbs |
| 6,388,736 B1 | 5/2002 | Smith et al. |
| 6,855,486 B1 * | 2/2005 | Finders et al. ............ 430/394 |

* cited by examiner

*Primary Examiner*—John A. McPherson
*Assistant Examiner*—Daborah Chacko-Davis
(74) *Attorney, Agent, or Firm*—Fish & Richardson P.C.

(57) ABSTRACT

A system for fabricating patterns on a semiconductor, the system includes a first aperture having two openings aligned in a first axis, a first mask, a second aperture having two openings aligned in a second axis, and a second mask. The system may be implemented with the second axis substantially perpendicular to the first axis.

8 Claims, 3 Drawing Sheets

DIPOLE ILLUMINATION

BACKGROUND

This description relates to fabricating semiconductors.

Patterns may be fabricated on a semiconductor (e.g., a silicon wafer) by transmitting beams of light through a mask and onto a surface of the semiconductor. In order to produce patterns with extremely small pitches (i.e., the distances between lines) on a semiconductor a phase shifting mask (PSM) may be used. PSMs cause the shifting of the phase of a light source so that the peaks of one wave of light lines up with the valleys of an adjacent wave, effectively canceling each other out and producing a dual-beam image (a "shadow" image) between the waves that is smaller than the two waves themselves. The dual-beam image may be used to fabricate patterns having pitches as low as one-half the theoretical minimum pitch of the light source. In the PSM fabrication technique, light source beams are transmitted through zero degrees and 180 degrees and, when passing through the PSM mask, result in cancellation of the zero degree order of the light.

Fabrication of semiconductor patterns may be achieved by performing a double-light exposure which refers to a first light exposure in a lateral axis (e.g., an "x-axis exposure") followed by a second light exposure in a second orthogonal axis (e.g., a "y-axis exposure").

"Negative" photoresistive materials ("resists") may be used as part of a semiconductor patterning process. Negative resists refers to the property of a resist that becomes insoluble when exposed to a light beam, therefore the exposed area of the negative resists remains on the substrate after processing of the semiconductor substrate.

DESCRIPTION

Figure 1:
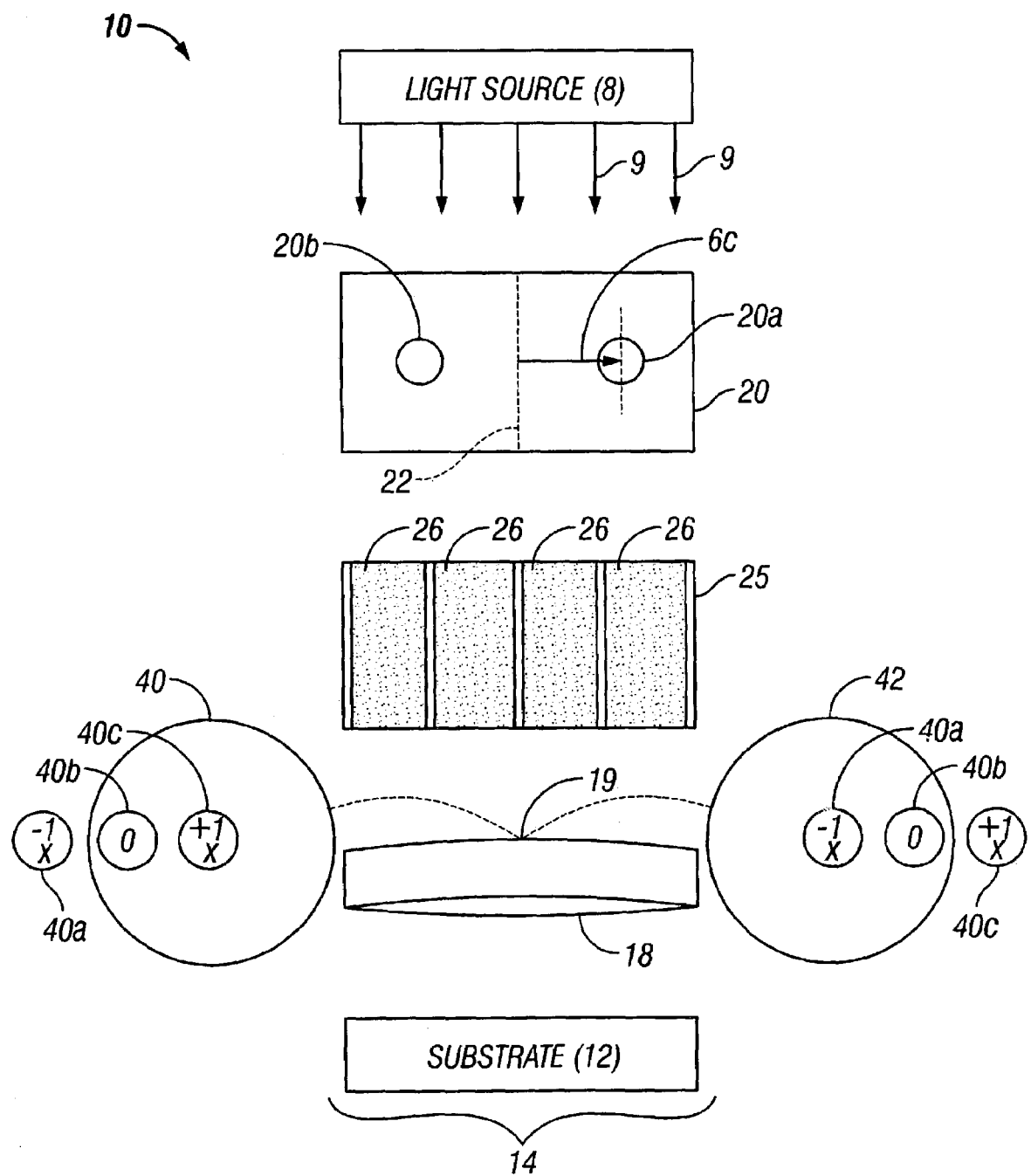
FIG. 1 is a diagram of a dipole illumination apparatus corresponding to a first exposure of a substrate.
Figure 2:
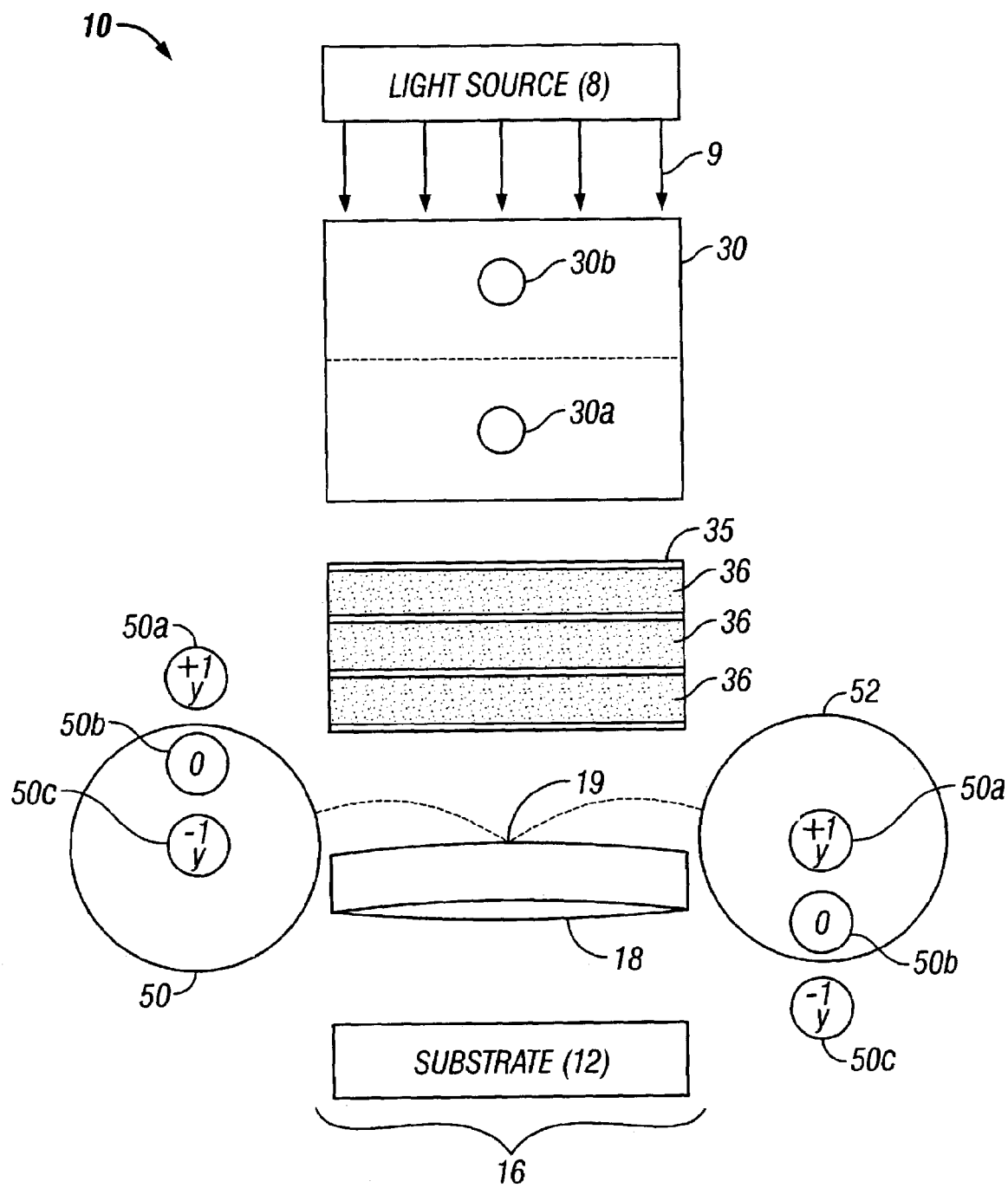
FIG. 2 is a diagram of a dipole illumination apparatus corresponding to a second exposure for a substrate.

FIGS. 1 and 2 depict a dipole illumination system 10 that may be used to form patterns using a double-light exposure on a semiconductor substrate 12. System 10 includes a first dipole aperture 20 and a first mask 25 that are used for forming x-axis features on substrate 12 (during a first exposure 14 of substrate 12, see FIG. 1), and a second dipole aperture 30 and a second mask 35 that are used for forming y-axis features (during a second exposure 16 of substrate 12, see FIG. 2). In more detail, first mask 25 includes openings 26 that allow the passing of spatial frequencies in a lateral (x-axis) direction, and first aperture 20 includes a first set of dipole openings 20a and 20b that diffract light source beams 9 in the x-axis. As will be explained, dipole opening 20b causes the $0^{th}$ and +1 order of light in the x-axis to be "collected" (e.g., combined) on the pupil of lens 18, and dipole opening 20a causes the $0^{th}$ and −1 order of light in the x-axis to be collected on the pupil of lens 18. Similarly, second mask 35 includes openings 36 to allow the passing of spatial frequencies in a longitudinal (y-axis) direction, and second aperture 30 includes a second set of dipole openings 30a–30b that diffract light source beams 9 in the y-axis onto lens 18. Dipole opening 30b causes the $0^{th}$ and +1 order of light in the y-axis to be collected on the pupil of lens 18, and dipole opening 30a causes the $0^{th}$ and −1 order of light in the y-axis to be collected on the pupil of lens 18. The smaller the pitch between features (e.g., openings) in masks 25 and/or 35, the smaller the intensity of the diffracted ±1 orders of light passed through those features from apertures 20 and/or 30, respectively. Therefore, at relatively small pitches the decreased intensity of the diffracted ±1 orders of light at the center of the lens 18 is similar to that created using a PSM where the $0^{th}$ order light at the center of the lens is effectively cancelled.

FIG. 1 includes top-down views 40 and 42 that depict the distribution of diffracted light onto the top 19 of lens 18 after passing through dipole openings 20b and 20a, respectively. In both top-down views 40 and 42, the diffracted beam patterns include a $0^{th}$ order light 40b, and ±1 light 40a and 40c. As shown in top-down view 40, the diffraction of light beam 9 through first dipole opening 20b causes the x-axis −1 light 40a to be shifted off lens 18, the $0^{th}$ order light 40b to be shifted to an edge of the entrance pupil of lens 18, and x-axis +1 light 40c to be shifted onto the top 19 of lens 18 (and passed through lens 18 to substrate 12). Referring to top-down view 42, the diffraction of light beam 9 through mask 25 by second dipole opening 20a causes the x-axis +1 light 40c to be shifted off lens 18, $0^{th}$ order light 40b to be shifted to an edge of lens 18, and the x-axis −1 light 40a to be shifted onto the top 19 of lens 18 (and passed through lens 18 to substrate 12).

Similarly, FIG. 2 includes top-down views 50 and 52 that depict the distribution of diffracted light onto the top 19 of lens 18 after passing through dipole openings 30b and 30a, respectively. In both top-down views 50 and 52, the diffracted beam patterns include a $0^{th}$ order light 50b, and ±1 light 50a and 50c. Referring to top-down view 50, the diffraction of light beam 9 through first dipole opening 30b causes the y-axis −1 light 50a to be shifted off the lens 18, the $0^{th}$ order light 50b to be shifted to an edge of the entrance pupil of lens 18, and x-axis +1 light 50c to be shifted onto the top 19 of lens 18 (and passed through lens 18). Similarly, as shown in top-down view 52, the diffraction of light beam 9 through second dipole opening 30a causes the y-axis −1 light 50c to be shifted off the lens 18, the $0^{th}$ order light 50b to be shifted to an edge of lens 18, and the y-axis +1 light 50c to be passed onto the top 19 of lens 18.

Masks 25 and 35 are examples of so-called binary masks, e.g., masks arranged to have spatial frequencies in a single direction, or axis. Binary masks are relatively simple to fabricate and inspect for defects as compared to phase-shift masks (PSMs), and in particular, as compared to chromeless PSMs. Therefore, the use of system 10 to fabricate patterns on a semiconductor may be performed using relatively simple binary masks.

In an embodiment, the resolution (e.g., the "pitch") of line patterns formed on a semiconductor depends, in part, on the location and/or the diameter of the dipole opening on an aperture. For example, the further apart dipole openings 20a–20b are located from the center 22 of aperture 20 the smaller the pitch of system 10. The diameter and locations from the center line of the dipole openings may be expressed in terms of $\sigma_c$, which refers to units of partial coherence (i.e., Numerical Aperture Condenser/Numerical Aperture Imaging). In an embodiment, $\sigma_c$ is within a range 0 to 1, inclusive.

In an embodiment, pitch is defined by the equation:

$$\text{pitch} = \lambda / (2 \text{ NA} \times \sigma_c), \text{ where } \lambda = \text{wavelength}.$$

Therefore, using an exemplary light source beam wavelength of 193 nm, 0.6 NA and with dipole openings of 0.05 $\sigma_c$, located at at $\sigma_c=0.95$, the minimum pitch would equal approximately 170 nm. Or, as another example, using a light source beam wavelength of 193 nm stepper with 0.75 NA, and with openings of 0.05 $\sigma_c$, located at $\sigma_c=0.95$, the minimum pitch would equal approximately 135 nm.

Figure 3:
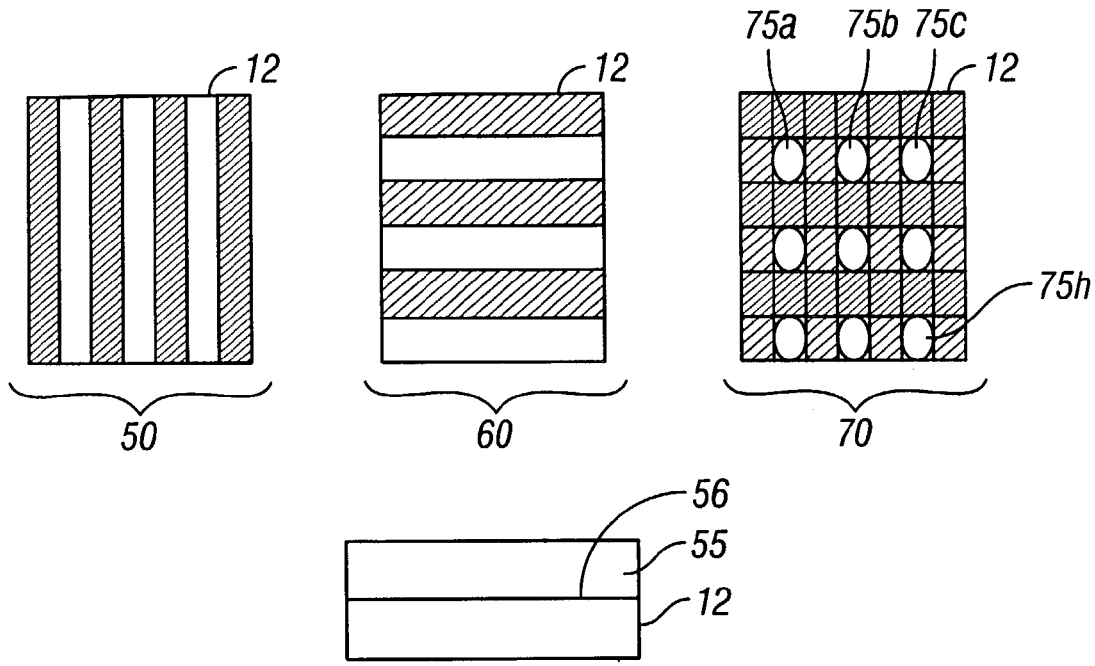
FIG. 3 is a diagram of a substrate that may be produced using the apparatus of FIGS. 1 and 2.

FIG. 3 shows a pattern that may be formed on a negative resist coating 55 on a surface 56 of substrate 12 using system 10. As described herein, negative resists may be used to create patterns on a substrate, e.g., where the light exposure on the negative resist causes the exposed area to become insoluble and remain after processing of the substrate. In this example, first exposure 14 (using aperture 20 and mask 25) causes line/space pattern 50 to be formed on substrate 12, and second exposure 16 (using aperture 30 and mask 35) causes line/space pattern 60 to be formed on substrate 12. Pattern 70 represents a combined pattern of patterns 50 and 60, which leaves voids 75a–75n between the exposed patterns 50 and 60.

In an embodiment, voids 75a–75n expose areas in a lower layer of substrate 12, i.e., a lower layer beneath negative resist coating 55. In an embodiment, voids 75a–75n expose areas usable as electrical contacts in the lower layer, e.g., the contacts may be useful in the fabrication of a semiconductor device, such as a semiconductor memory device.

Figure 4:
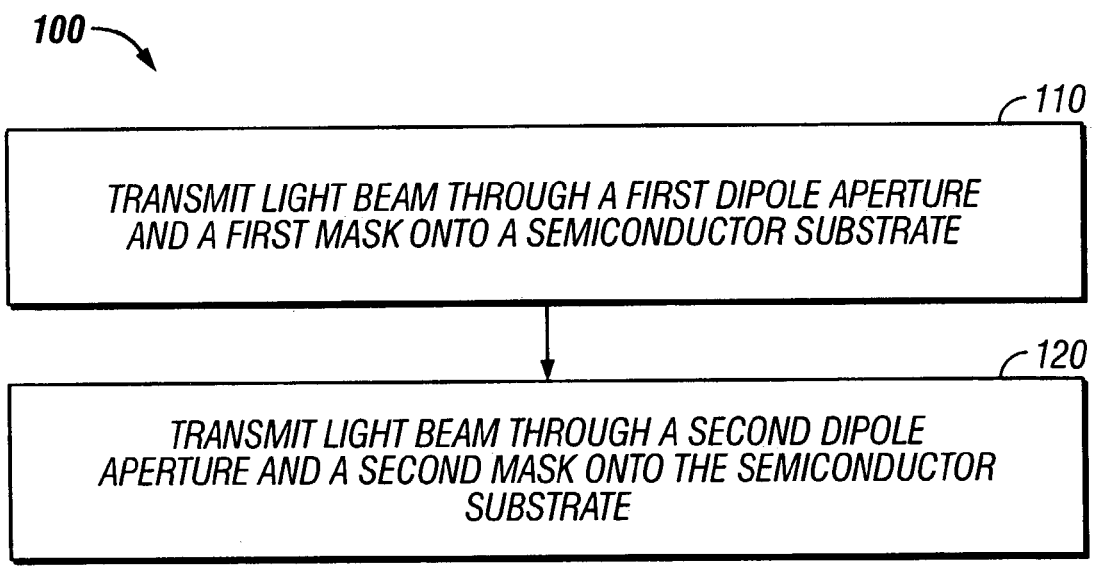
FIG. 4 is a flowchart of a process that may be performed using the apparatus of FIGS. 1 and 2.

FIG. 4 depicts a flowchart of process 100 that may be used to form a pattern on a semiconductor. Process 100 includes transmitting (110) a light source beam through a first dipole aperture and a first mask in a first axis onto a semiconductor, and transmitting (120) a light source beam through a second dipole aperture and a second mask in a second axis onto the semiconductor to form a pattern on the semiconductor. Process 100 may optionally include forming a pattern on a negative resist layer on the semiconductor (not shown).

The invention is not limited to the specific embodiments described above. For example, some embodiments described the formation of a pattern that included contact "holes" that are essentially round in shape. However, other pattern geometries may be formed using the dipole illumination apparatus using different shapes and patterns formed on the mask(s).

Other embodiments not described herein are also within the scope of the following claims.

What is claimed is:

1. A system for fabricating patterns on a semiconductor substrate having a layer of negative photoresistive material thereon, the system comprising:
   a first dipole aperture having two aperture openings aligned in a first axis;
   a first binary mask to generate a first pattern, the first binary mask comprising mask openings allowing substantially only spatial frequencies along the first axis to pass therethrough;
   a second dipole aperture having two aperture openings aligned in a second axis substantially perpendicular to the first axis; and
   a second binary mask to generate a second pattern overlaying the first pattern and to form a plurality of voids enclosed by the first and second patterns, the second binary mask comprising mask openings allowing substantially only spatial frequencies along the second axis to pass therethrough.

2. The system of claim 1, wherein a diameter of the two aperture openings of first and second apertures are substantially equal and the distance between the two aperture openings is greater than zero but less than or equal to two times the diameter.

3. The system of claim 1, further comprises:
   a light source for passing light through the first binary mask and the second binary mask.

4. A method of forming a pattern on a semiconductor comprising:
   transmitting light through a first aperture having at least two aperture openings aligned in a first axis;
   transmitting the light from the first aperture through a first binary mask onto a semiconductor substrate having a layer of negative photoresistive material thereon to form a first pattern on an upper layer, the first binary mask comprising mask openings allowing substantially only spatial frequencies along the first axis to pass therethrough;
   transmitting light through a second aperture having at least two aperture openings aligned in a second axis, the second axis being substantially perpendicular to the first axis;
   transmitting light from the second aperture through a second binary mask onto the semiconductor substrate to form a second pattern on the upper layer overlaying the first pattern and to form a plurality of voids enclosed by the first and second patterns, the second binary mask comprising mask openings allowing substantially only spatial frequencies along the second axis to pass therethrough; and
   providing electrical contact via the plurality of voids to a lower layer.

5. The method of claim 4, wherein a diameter of the two aperture openings of first and second apertures are substantially equal and the distance between the two aperture openings is greater than zero but less than or equal to two times the diameter.

6. An apparatus comprising:
   a first dipole aperture having two aperture openings aligned in a first axis;
   a first binary mask to form a first pattern on a substrate having a layer of negative photoresistive material thereon, the first binary mask comprising mask opening allowing substantially only spatial frequencies along the first axis to pass therethrough;
   a second aperture having two aperture openings aligned in a second axis; and
   a second binary mask to form a second pattern on the first pattern overlaying the first pattern and to form a plurality of voids enclosed by the first and second patterns, the second binary mask comprising mask openings allowing substantially only spatial frequencies along the second axis to pass therethrough.

7. The apparatus of claim 6, wherein a diameter of the two aperture openings of first and second apertures are substantially equal and the distance between the two aperture openings of is greater than zero but less than or equal to two times the diameter.

8. The apparatus of claim 6, further comprises:
   a light source for passing light through at least one of the first binary mask and the first aperture, and the second binary mask and the second aperture.

* * * * *